United States Patent [19]
Brauer et al.

[11] Patent Number: 5,153,986
[45] Date of Patent: Oct. 13, 1992

[54] METHOD FOR FABRICATING METAL CORE LAYERS FOR A MULTI-LAYER CIRCUIT BOARD

[75] Inventors: John M. Brauer, Binghamton; Frederick R. Christie, Endicott; William H. Lawrence, Greene; Ashit A. Mehta, Vestal; Jonathan D. Reid, Johnson City; William J. Summa, Endwell, all of N.Y.

[73] Assignee: International Business Machines, Armonk, N.Y.

[21] Appl. No.: 731,598

[22] Filed: Jul. 17, 1991

[51] Int. Cl.$^5$ ............................................. H05K 3/02
[52] U.S. Cl. ..................................... 29/846; 29/830; 29/852; 156/60; 156/630; 427/97; 428/901
[58] Field of Search .................. 29/830, 842, 844, 852, 29/854; 156/901, 60, 902, 630; 428/901; 427/97

[56] References Cited

U.S. PATENT DOCUMENTS

| | | | |
|---|---|---|---|
| 3,853,961 | 12/1974 | Birkenstock et al. | 260/485 |
| 3,934,334 | 1/1976 | Hanni . | |
| 3,958,317 | 5/1976 | Peart et al. | 29/195 |
| 4,145,460 | 3/1979 | Finley et al. | 427/97 |
| 4,188,415 | 2/1980 | Takahashi et al. | 427/97 |
| 4,254,172 | 3/1981 | Takahashi et al. | 428/131 |
| 4,303,715 | 12/1981 | Chang | 428/137 |
| 4,416,725 | 11/1983 | Cuomo et al. | 156/635 |
| 4,499,152 | 2/1985 | Green et al. | 428/901 X |
| 4,524,089 | 6/1985 | Hague et al. | 427/38 |
| 4,588,641 | 5/1986 | Hague et al. | 428/413 |
| 4,601,916 | 7/1986 | Arachtingi | 427/97 |
| 4,783,247 | 11/1988 | Seibel | 204/181.1 |
| 4,830,704 | 5/1989 | Voss et al. | 29/852 X |
| 4,910,077 | 3/1990 | Benedikt | 29/830 X |
| 4,923,678 | 5/1990 | Benedikt | 156/60 X |
| 5,047,174 | 9/1991 | Frisch et al. | 156/630 |
| 5,073,456 | 12/1991 | Palladino | 428/901 X |

*Primary Examiner*—Carl J. Arbes
*Attorney, Agent, or Firm*—Richard M. Goldman

[57] ABSTRACT

Disclosed is a method of fabricating a multilayer electronic circuit package. The multilayer circuit package has at least one layer that is a circuitized, polymer encapsulated metal core. According to the method of the invention a metal foil is provided for the metal core of the layer. This metal core foil may be provided as a single unit or in a continuous, roll to roll, process. The vias and through holes are drilled, etched, or punched through the metal foil. An adhesion promoter is then applied to the perforate metal foil for subsequent adhesion of polymer to the foil. The dielectric polymer is then applied to the perforate metal foil core by vapor depositing, chemical vapor depositing, spraying or electrophoretically depositing, a thermally processable dielectric polymer or precursor thereof onto exposed surfaces of the perforate metal foil including the walls of the through holes and vias. The dielectric polymer or precursor thereof is then thermally processed to form a conformal dielectric, polymeric coating on surfaces of the perforate metal foil, including the interior surfaces of the vias and through holes. This dielectric, polymeric coating may then be circuitized, and coated with an adhesive for lamination to the next adjacent layer. After lamination, one or more chips are attached to the completed package.

15 Claims, 3 Drawing Sheets

METHOD FOR FABRICATING METAL CORE LAYERS FOR A MULTI-LAYER CIRCUIT BOARD

FIELD OF THE INVENTION

The invention relates to methods for fabricating a multilayer electronic circuit packages having at least one layer that is a circuitized, polymer encapsulated metal core. More particularly, the invention relates to encapsulating a perforate metal foil by depositing a thermally processable dielectric polymer onto exposed surfaces of the perforate metal foil including the walls of the through holes and vias. The dielectric polymer is then thermally processed to form a conformal dielectric, polymeric coating on surfaces of the perforate metal foil, including the interior surfaces of the vias and through holes. This dielectric, polymeric coating may then be circuitized, and coated or laminated with an adhesive liquid or film for lamination to the next adjacent layer.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packacing Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation.

Packages may be characterized by the material used as the dielectric, i.e., as ceramic packages or as polymeric packages. One type of polymeric package is a metal core package, having a metal core, for example a copper core, a molybdenum core, or a Copper-Invar-Copper core, encapsulated in a polymeric dielectric material.

"Invar" is a registered trademark of Imphy S. A., 168 Rue De Rivoli, Paris, France for an "alloy which is substantially inexpansible," Registration No. 0063970. Invar is an iron-nickel alloy containing approximately sixty four weight percent iron and thirty six weight percent nickel.

Metal core printed circuit boards are described by Nandakumar G. Aakalu and Frank J. Bolda in "Coated-Metal Packaging", in Rao R. Tummala and Eugene J. Rymaszewski, *Microelectronic Packaging Handbook*, Van Nostrand Reinhold, New York, N.Y. (1988), at pages 923 to 953, specifically incorporated herein by reference.

As used herein, coated metal packages, also referred to as metal core packages, are polymer encapsulated conductive metal cores. Circuitization, that is, personalization, is carried out on the surface of the polymeric encapsulant, with vias and through holes passing through the polymeric encapsulant and the metal core.

The metal core may be a copper core, a molybdenum core, or a Copper-Invar-Copper core. Copper and Copper-Invar-Copper cores spread out the heat from the devices mounted on the card or board. The high thermal conductivity allows the devices, for example the memory devices or logic devices, to operate at lower temperatures. The metal core also provides high mechanical strength and rigidity to the package. The metal core allows the substrate to carry large and heavy components, and to function in environments where shock, vibration, heat, and survivability are a factor.

Copper-Invar-Copper is a particularly desirable core material because of its thermal, electrical, and mechanical properties. Invar is an iron-nickel alloy containing approximately sixty four weight percent iron and thirty six weight percent nickel. While deviations from this composition are possible, the 64-36 alloy has the lowest coefficient of thermal expansion in the iron-nickel binary system, approximately $1.5 \times 10^{-7}$/degree Centigrade.

Lamination of the Invar between copper films of controlled thickness determines the properties of the Copper-Invar-Copper core. This is shown in Table 1, below, adapted from Nandakumar G. Aakalu and Frank J. Bolda in "Coated-Metal Packaging", in Rao R. Tummala and Eugene J. Rymaszewski, *Microelectronic Packacing Handbook*, Van Nostrand Reinhold, New York, N.Y. (1988), Table 13-2, at page 932.

TABLE 1

| Properties of Copper-Invar-Copper | | |
|---|---|---|
| Property | Cu/In/Cu | Cu/In/Cu |
| % Cu/% Invar/% Cu | 12.5/75/12.5 | 20/60/20 |
| Coefficient of thermal expansion ($\times 10^{-7}$/deg C.) | 44 | 53 |
| Electrical Resistivity (micro-ohm-cm) | 7.0 | 4.3 |
| Young's Modulus ($10^5$ mPa) | 1.4 | 1.35 |
| Enlongation (%) | 2.0 | 2.5 |
| Tensile Strength (mPa) | 380–480 | 310–410 |

TABLE 1-continued

| Properties of Copper-Invar-Copper | | |
|---|---|---|
| Density (grams/cm$^3$) | 8.33 | 8.43 |
| Thermal Conductivity (10$^{-7}$/degree Centigrade) | | |
| x-y plane | 107 | 160 |
| z plane | 14 | 18 |
| Thermal Diffusivity (cm$^2$/second) | 0.249 | 0.432 |
| Specific Heat (Watts/gm deg C.) | 0.484 | 0.459 |
| Yield Strength | 240–340 | 170–270 |

The encapsulating polymer may be a fluorocarbon, a phenolic, an epoxy, a xylylene, a benzocyclobutene, or a polyimide.

Two critical problems in metal core packages are the adhesion of the polymeric dielectric encapsulant and the manufacturability, including encapsulation, alignment, registration, and drilling. In the case of adhesion of the polymer to the underlying metal, the tear strength between pyromellitic dianhydride oxydianiline (PMDA-ODA) and a chromium coated, 0.002 inch thick, Copper/Invar/Copper substrate is on the order of 1 to 2 grams per millimeter. The failure site is at the polyimide - chromium interface.

Various approaches have been used to improve the adhesion of polymers, as polyimides, to metals, as copper. For example, U.S. Pat. No. 4,902,551 to Yuko Kimura, Akishi Nakaso, Haruo Ogino, Toshiro Okamura, and Tomoko Watanabe (assignors to Hitachi Chemical Co., Ltd) recognizes the existence of a copper oxide layer on the copper, and first forms the copper oxide layer in a alkaline solution and thereafter electrolytically removes the copper oxide layer to enhance the adhesion of the polymer to the copper.

In U.S. Pat. No. 3,958,317 of Leland L. Peart and John S. Schiavo, assigned to Rockwell International, a copper chromium laminate is described, with an epoxy resin bonded thereto. In order to promote the adhesion of the epoxy resin, the chromium is partially etched. It is stated that the roughened, cracked chromium surface improved the adhesion of the epoxy thereto.

In U.S. Pat. No. 3,853,961 to E. Caule, assigned to Olin, plastic is laminated to copper to provide a tarnish free coating. The copper substrate is oxidized to form an oxide film, and then reacted with a phosphate to form a glassy, copper phosphate coating. The polymer is laminated to this coating.

In U.S. Pat. Nos. 4,524,089 and 4,588,641 of R. Haque and E. F. Smith (assigned to Olin Corp.) there is described a method of coating a a polymeric film onto a copper substrate. This is a multi-step, multi-plasma process. As described in Haque et al., the substrate is exposed to an oxygen plasma, then to a hydrocarbon monomer gas plasma, and finally to another oxygen plasma.

In U.S. Pat. No. 4,416,725 to J. J.. Cuomo, P. A. Leary, and D. S, Yee (assigned to International Business Machines Corp.) there is described a method of coating a copper surface by placing it in a chamber, charging the chamber with iodine vapor, and forming an iodine plasma to form a copper iodide film. The copper iodide film is then textured. This is reported to improve the adhesion of coatings, as polyimide, polyester, and polymethyl methacrylate, to the copper.

Other techniques to improve the adhesion of polyimide to copper, as the copper surface of a Cu/Invar/Cu body, include applying a thin film, metallic adhesion layer, as a thin film adhesion layer of chromium, to the copper. Still other techniques include treatment with oxygen containing or forming plasmas, stress relief, and chemical pre-treatments. Notwithstanding these expedients, metal-polyimide adhesion values of only 1-2 grams/millimeter were obtained.

The adhesion of the dielectric polymer to the underlying metal core and the manufacturability of the resulting layer must enhance the subsequent processing of the composite. Subsequent processing of metal core packages includes circuitization, that is, the formation of a Cu signal pattern or power pattern on the polymeric encapsulant, the lamination of the layers to form a multilayer package, and the attachment of chips to the package.

Circuitization may be additive or subtractive. Subtractive circuitization is described, for example in Gerald W. Jones, Jane M. Shaw, and Donald E. Barr, *Lithography In Electronic Circuit Packaging*, in Chapter 12 of Seraphim et al., *Principles of Electronic Packaging*, pages 372–423. As described therein, copper is applied to the substrate. This copper generally has a thickness of about 1.4 mils (one ounce per square foot). Thereafter a resist is placed on the copper coated printed circuit board substrate to define the printed circuit on circuitization. After, e.g., exposure and development, the resist covers the copper in areas that are to become circuit traces, and leaves the rest of the copper exposed.

The board, with patterned resist atop the copper, is passed through an etching chamber containing copper etchants. These etchants convert the copper to water soluble copper compounds and complexes which are removed by spray action.

The copper that was underneath the resist is not attacked by the etchants. After etching the resist is stripped, that is, chemically debonded and mechanically removed, leaving behind copper in the form of the desired circuit traces.

The composite printed circuit package is fabricated by interleaving cores (that is, metal core packages, including signal cores, signal/signal cores, power cores, power/power cores, and signal/power cores) with additional metal core layers, and surface circuitization. Holes, as vias and through holes, are drilled in individual core structures before circuitization.

One problem that has been observed with the manufacture of the above described metal core packages is the high temperature lamination of the polymeric dielectric to the metal core. Another problem is the accurate alignment of the laser drilled and/or mechanically punched holes with the vias and through holes previously drilled or punched in the metal foil core. A third problem is the laser processability of some polymeric dielectrics.

Attempts to remedy these problems have involved the application and curing of conformal coatings of the polymeric dielectrics to the metal foil core material, as described, for example, in U.S. Pat. No. 3,934,334 to Stephen L. Hanni for METHOD OF FABRICATING METAL PRINTED WIRING BOARDS, U.S. Pat. No. 4,188,415 to Hiroshi Takahashi, Kiyoshi Nakao, and Maasaki Katagiri for BASEBOARD FOR PRINTED CIRCUIT BOARD AND METHOD OF PRODUCING THE SAME, U.S. Pat. No. 4,254,172 to Hiroshi Takahashi, Kiyoshi Nakao, and Maasaki Katagiri for BASEBOARD FOR PRINTED CIRCUIT BOARD, U.S. Pat. No. 4,303,715 to Joseph J.

Chang for PRINTED WIRING BOARD, and U.S. Pat. No. 4,783,247 to Markus Seibel for METHOD AND MANUFACTURE FOR ELECTRICALLY INSULATING BASE MATERIAL USED IN PLATED THROUGH HOLE PRINTED CIRCUIT PANELS.

U.S. Pat. No. 4,188,415 to Hiroshi Takahashi, Kiyoshi Nakao, and Maasaki Katagiri for BASEBOARD FOR PRINTED CIRCUIT BOARD AND METHOD OF PRODUCING THE SAME, and U.S. Pat. No. 4,254,172 to Hiroshi Takahashi, Kiyoshi Nakao, and Maasaki Katagiri for BASEBOARD FOR PRINTED CIRCUIT BOARD apply the dielectric by dip coating. In the disclosed process the viscosity of the uncured dielectric coating material is controlled to obtain conformal coating.

U.S. Pat. No. 4,303,715 to Joseph J. Chang for PRINTED WIRING BOARD, and U.S. Pat. No. 4,783,247 to Markus Seibel for METHOD AND MANUFACTURE FOR ELECTRICALLY INSULATING BASE MATERIAL USED IN PLATED THROUGH HOLE PRINTED CIRCUIT PANELS seek to obtain conformal coating on perforated foil cores with electrostatic coating followed by successive passes with techniques complimentary to dipping.

OBJECTS OF THE INVENTION

It is, therefore, an object of the invention to obtain accurate alignment of what have heretofore been punched, etched, and/or drilled vias and through holes.

A further object of the invention is to form holes and vias of uniform size and quality relative to those formed by laser drilling or by punching.

A still further object of the invention is to provide holes and vias without laser drilling, mechanical drilling, punching, or etching through a polymer-metal composite, utilizing conformal coating.

A still further object of the invention is to attain these objects while substantially eliminating drilling and lamination and replacing them with a rapid, low cost conformal coating process.

SUMMARY OF THE INVENTION

These objects are attained and the shortcomings of the prior art obviated by the method of the invention. According to the method of the invention a multilayer electronic circuit package is fabricated. The multilayer circuit package has at least one layer that is a circuitized, polymer encapsulated metal core. According to the method of the invention a metal foil is provided for the metal core of the layer. This metal core foil may be provided as a single unit or in a continuous, roll to roll, process. The vias and through holes are drilled, punched, or etched through the metal foil. An adhesion promoter, as a metallic adhesion promoter, as chromium, or an organosilane, or layers of chromium and an organosilane, is then applied to the perforate metal foil for subsequent adhesion of polymer to the foil. The dielectric polymer or precursor thereof is then applied to the perforate metal foil core, including the walls of the through holes, vias, and other perforations by a conformal coating technique. The conformal coating technique, which produces substantially uniform coatings of the dielectric in the vias, through holes, and perforations, as well as on the surfaces of the foil, may be deposition from a liquid, or from a gas, or even from a dispersion, fog, or mist of a liquid in a gaseous or vaporized carrier. The thermally processable dielectric polymer or precursor is deposited onto exposed surfaces of the perforate metal foil including the walls of the through holes and vias, so as to produce a uniform coating thereon.

The dielectric polymer or precursor is then thermally processed to form a substantially uniform, conformal dielectric, polymeric coating on surfaces of the perforate metal foil, including the interior surfaces of the vias and through holes. This dielectric, polymeric coating may then be circuitized, and coated with a liquid adhesive or interleaved with an adhesive film for lamination to the next adjacent layer.

Thus, according to the method of the invention, it is now possible to achieve the objects of the invention, including accurately aligning what have heretofore been punched, etched, and/or drilled vias and through holes with accurate through holes and vias that are conformally coated. It is also possible to form holes and vias of uniform size and quality relative to those formed by laser drilling, mechanical drilling, etching, or by punching, is also achieved. This is accomplished with the substantial elimination of drilling through the dielectric, and lamination at drilled dielectric surfaces, and the replacement thereof by a rapid, low cost conformal coating process, for example, a vapor deposition process, a spray coating process, or an electrophoretic process.

THE FIGURES

FIG. 1 is a flow chart of a method of the invention.

FIGS. 2A, 2B, and 2C are isometric views of a section of a metal core layer in successive stages of fabrication.

DETAILED DESCRIPTION OF THE INVENTION

The invention is a method of fabricating a multi-layer circuit package having at least one layer formed of a dielectric polymer encased metal core, and, more particularly, a method of fabricating the polymer encapsulated metal core layer.

Figure 1:
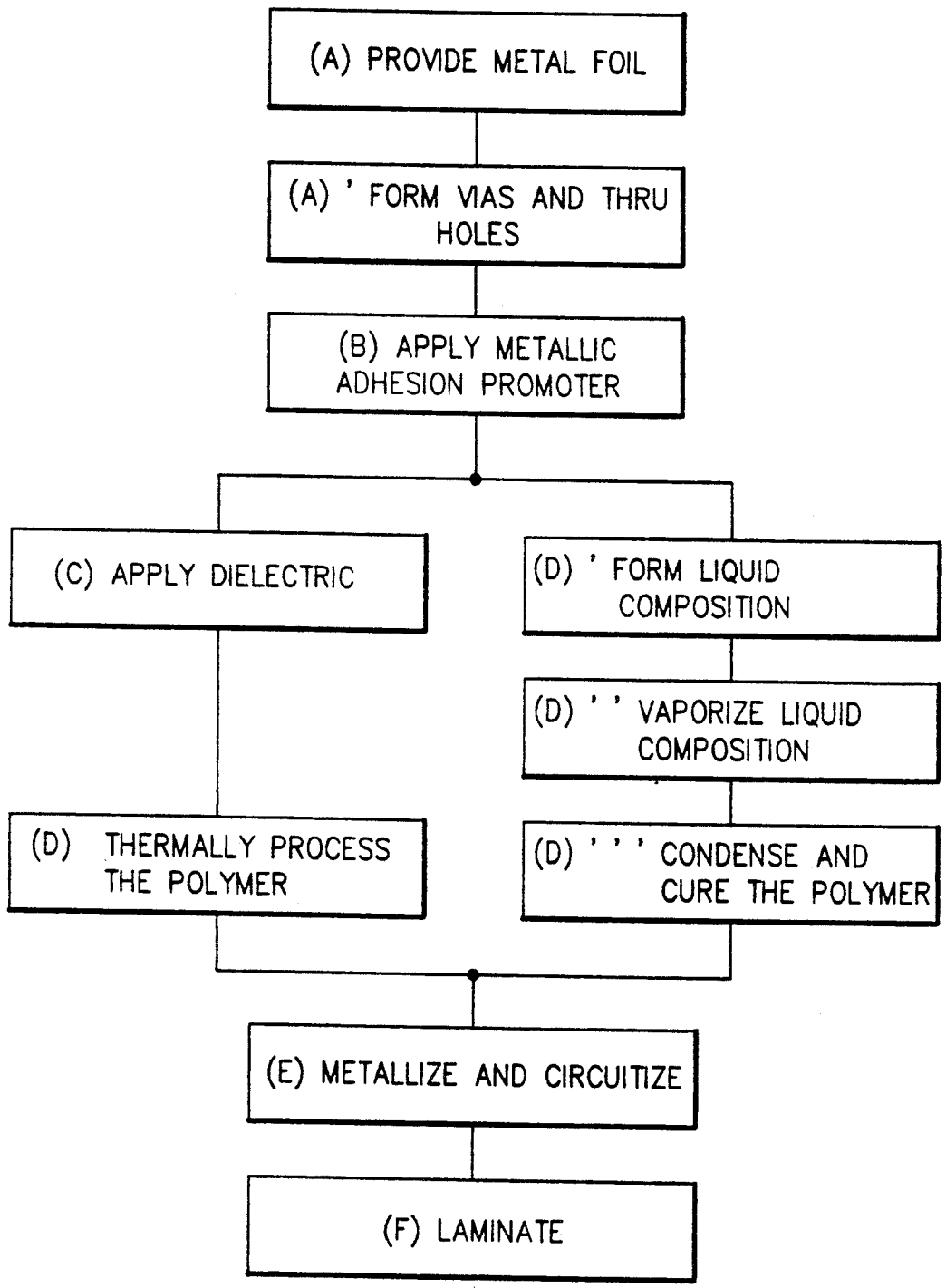

According to a preferred exemplification of the invention, illustrated in the flow chart of FIG. 1, the single layer is prepared by providing a metal foil for the metal core of the layer and drilling, punching, or ferric chloride or cupric chloride etching at least one through hole in the metal foil. The metal foil may be a copper foil, e.g., a copper foil about 0.5 to 4.0 mils thick, or a Cu-Invar-Cu foil, or a molybdenum foil. When the metal foil is a Cu-Invar-Cu foil, it is typically about 0.5 to 4.0 mils thick, with a layer of Invar that is typically from about sixty percent to about ninety percent of the total thickness of the Cu-Invar-Cu metal foil interposed between the two layers of Cu, each Cu layer being from about five to about 20 percent of the total thickness of the Cu-Invar-Cu laminate. In a preferred exemplification, the Invar is about seventy five percent of the total thickness of the Cu-Invar-Cu laminate foil, and each Cu layer is about 12.5 percent of the total thickness of the Cu-Invar-Cu laminate foil.

Providing the thin metal foil is shown in block a of the flow chart, FIG. 1. The metal foil can be pre-shaped or provided as a continuous roll in a roll to roll process.

Next, an adhesion promoter, as an organosilane coupling agent or a metallic adhesion promoter, as chromium, or layers or films of both, is applied to the perforate metal foil. Applying the metallic adhesion promoter to the perforate metal foil is shown in block b of the flow chart. The metal adhesion promoter is necessary for subsequent adhesion of the polymeric dielectric encapsulant to the foil. Thus, according to a preferred exemplification of the invention, a thin film of, for example, chromium or an organosilane coupling agent, is applied to the perforate foil as an adhesion promoter for subsequent adhesion of polymer to the perforate metal foil. The chromium thin film may be applied by various techniques including electrodeposition and sputtering.

The thermally processable dielectric polymer or precursor thereof, i.e., the organic dielectric, is applied to the exposed surfaces of the perforate metal foil, as shown in block c of the flowchart of FIG. 1. The dielectric polymer or precursor thereof is applied to the perforate metal foil core, including the walls of the through holes, vias, and other perforations by a conformal coating technique. The conformal coating technique, which results in substantially uniform coatings of the organic dielectric in the vias, through holes, and perforations, as well as on the surfaces of the foil, may be chemical vapor deposition, deposition from a liquid, or from a gas, or even from a dispersion, fog, or mist of a liquid in a gaseous or vaporized carrier. Especially preferred is deposition from a gas, vapor, of dispersion, fog, or mist of a liquid in a gaseous carrier.

The thermally processable dielectric polymer or precursor is deposited onto exposed surfaces of the perforate metal foil including the walls of the through holes and vias, so as to produce a uniform coating thereon.

It is one advantage of the invention that the exposed surfaces that are coated with the metallic adhesion promoter and thereafter with the organic dielectric, i.e., the polymer or precursor thereof, include the walls of the vias, through holes, and other perforations.

The thermally processable, organic dielectric may be a thermoplastic polymer, or a thermoset polymer, e.g., a pre-polymer or a B-stage resin. Typical thermoplastic resins include poly (para-xylylenes), polytetrafluoroethylenes, poly (fluorinated ethylene-propylene), and poly (perfluoroalkoxies). Typical thermoset resins include polyimides, epoxies, and benzocyclobutenes. One particularly preferred class of thermally processable dielectric polymers include dispersion, suspensions, and mixtures of a thermoplastic polymer, as polytetrafluoroethylene, in a thermosetting resin carrier, as a phenolic carrier, optionally with a solvent or solvents, as an alcohol or an ether.

Next, the dielectric polymer is thermally processed. This step is shown in block d of the flowchart of FIG. 1. Thermal processing includes driving off solvents and carriers, as well as curing the dielectric polymer to form a polymeric dielectric conformal coating on the surfaces of the perforate metal foil. The thermally processable polymeric dielectric may be a thermoset resin, which is polymerized by thermal processing, or it may be a thermoplastic resin, which is caused to flow by thermal processing above its glass transition temperature, and preferably above its melting temperature.

This process of depositing and curing the thermally processable dielectric polymer may include forming a composition of the dielectric polymer in a carrier, for example in an alcohol, an ether, an aldehyde, a ketone, or the like, or in a liquid thermosetting resin, as a phenolic. This is shown in block d' of FIG. 1. Next, the composition of the dielectric polymer in the carrier is vaporized. This is shown in block d" of FIG. 1. The composition of the dielectric polymer in the carrier is then conveyed to the metal core where it is condensed or otherwise coated onto the metal core and cured. This is illustrated in block $d^{iii}$ of FIG. 1.

Note that while forming a gaseous composition of the dielectric and a carrier or solvent, followed by condensation and curing is described and shown in FIG. 1, other methods may be utilized, such as electrophoresis of a gas or liquid, spray coating, and the like.

Alternatively, the conformal coating may be applied and formed by a chemical vapor deposition process, such as with poly (para-xylylene). As used herein "parylene" means a polymer synthesized by pyrolysis of di-p-xylylene or a substituted derivative. Xylylene is an aromatic monomer having the formula

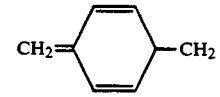

Substituted xylylenes include chloro-para-xylylene, dichloro-para-xylene, and perfluoro-para-xylylene, having the structures, respectively:

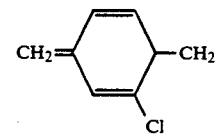

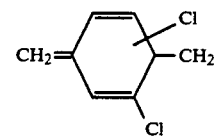

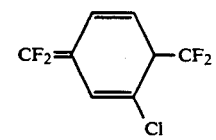

The di-para-xylylenes are dimers having the structure:

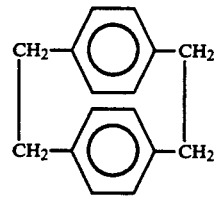

Figure 4:
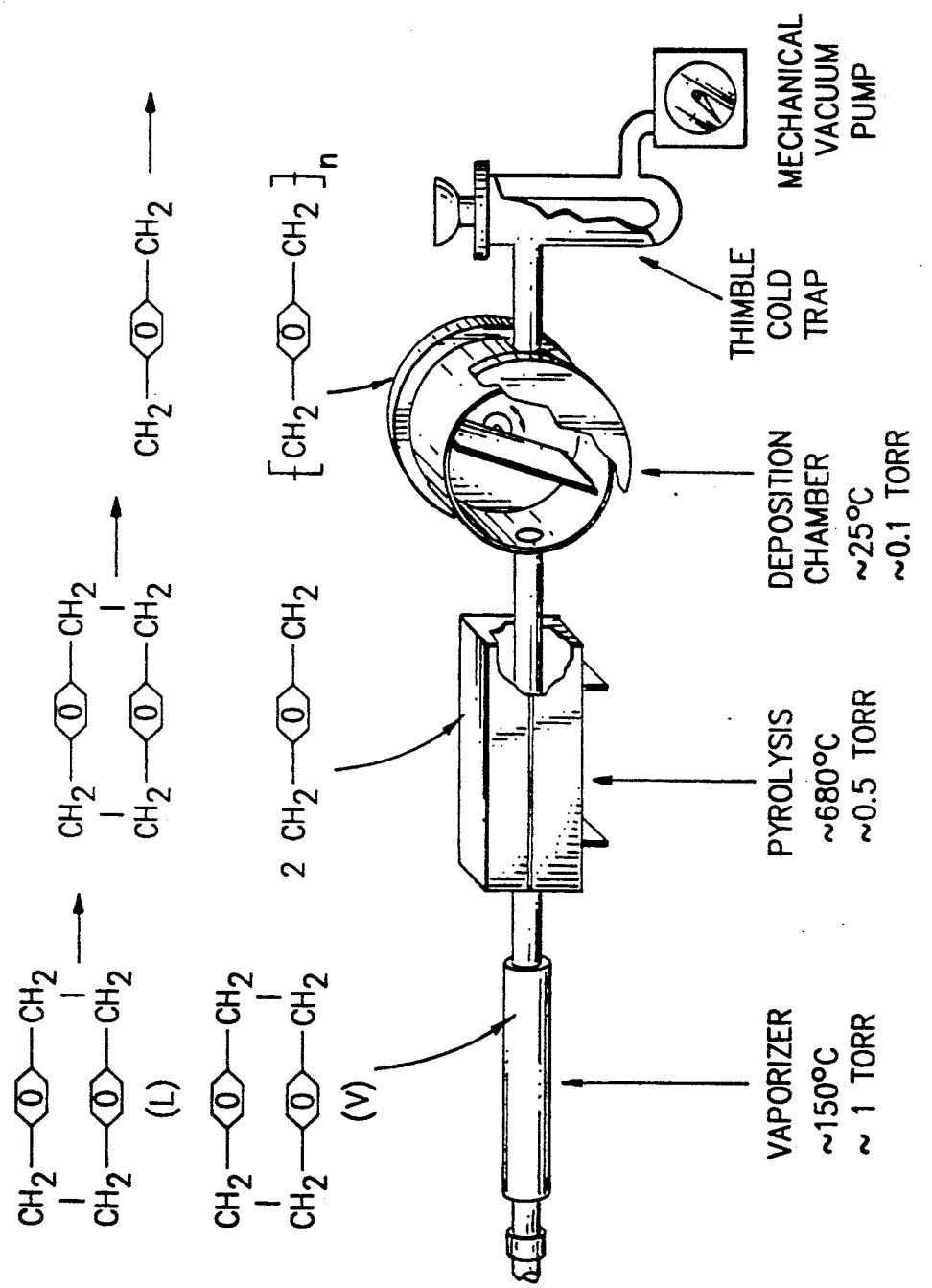
FIG. 4 is a flow chart of an alternative method of the invention utilizing poly (para-xylylene) as the conformal coating material.

In the conformal coating process of the invention, and illustrated in FIG. 4, the di-para-xylylene is vaporized at about 150 degrees Centigrade and a pressure of about 1 Torr or less, and pyrolyzed, e.g., at a temperature of about 600 degrees Centigrade or higher, and a pressure of about 0.5 Torr or less, to yield the para-xylylene monomer. The monomer then contacts the circuit board substrate, e.g., in a deposition chamber, at a temperature of about 25 degrees Centigrade and a pressure of 0.1 torr or less, to form a polymeric conformal coating. The polymerization of p-xylylenes on condensation is reported to be extremely rapid and to proceed from the gaseous para-xylylene monomer directly to the solid polymer without passing through a liquid stage. The monomer behaves as a reactive medium which surrounds solid objects placed in the deposition chamber.

Organosilane adhesion promoters are particularly preferred when the conformal coating is a poly paradixylylene coating formed by chemical vapor deposition. The organosilane adhesion promoters establish a bridge-type chemical bond between the substrate and the polymer. The adhesion promotion property of the organosilane is due to the unique chemical affinities of both organic and silane portions of the organosilane molecule. For example, when the Cu-Invar-Cu substrate is treated with a dilute solution of (GAMMA -methacryloxypropyl)trimethoxysilane, the silane part of the molecule bonds to the copper surface, while the organic part of the organosilane molecule bonds to the polymeric surface, that is, the poly para-xylylene film.

Alternatively, plasma pretreatment of the Cu or Cu-Invar-Cu foil may be utilized. Plasmas of argon and oxygen promote adhesion of poly(p-xylylene) coatings on Cu and Cu-Invar-Cu substrates.

The poly(p-xylylene) vapor-deposition process is a conformal coating process that is particularly advantageous in the herein described process. For example, poly(para-xylylene) films grow from the surface of the Cu or Cu-Invar-Cu substrate upward, covering everything with a uniform coating, especially the walls of high aspect ratio vias and through holes, without bridging.

In carrying out the method of the invention utilizing poly (para-xylylene), a small amount of anthracene may be added to the di-para-xylylene dimer starting material. The anthracene is not affected by the deposition and codeposits uniformly with the poly(para-xylylene) polymer. The anthracene allows uv inspection of the final conformally coated substrate for continuity.

Subsequently, after formation of the conformal coating, and as shown in block e of the flowchart of FIG. 1, the conformal surface of the dielectric polymer is metallized and circuitized. Metallization and circuitization may be a single step additive process, or a multi-step process of metallization and subtractive circuitization. Metallization may be the direct deposition of conductive metal, e.g., copper, atop the dielectric, polymeric encapsulant.

Alternatively, and preferably, metallization may be a multi-step process, with deposition of an adhesion promoter, as a polymeric adhesive or a metallic adhesion promoter to the dielectric polymeric encapsulant. For example, a suitable polyimide adhesive may be applied to the dielectric, polymeric encapsulant, and the circuitization applied atop the adhesive. Alternatively, the adhesion promoter may be a metallic thin film, as a chromium thin film, with the conductor, as copper, applied atop the chromium thin film. For example, a thin film of chromium may be sputtered atop the polymeric, dielectric encapsulant, and the copper applied atop the thin chromium layer. In this case the chromium layer is from about 200 Angstroms to about 600 Angstroms thick, and the copper circuitization layer is from about 0.2 to about 2.0 mils thick. Circuitization may be additive or subtractive.

The metallized, circuitized, metal core layer may now be laminated to another layer, as shown in block f of the flowchart of FIG. 1.

Figure 2A:
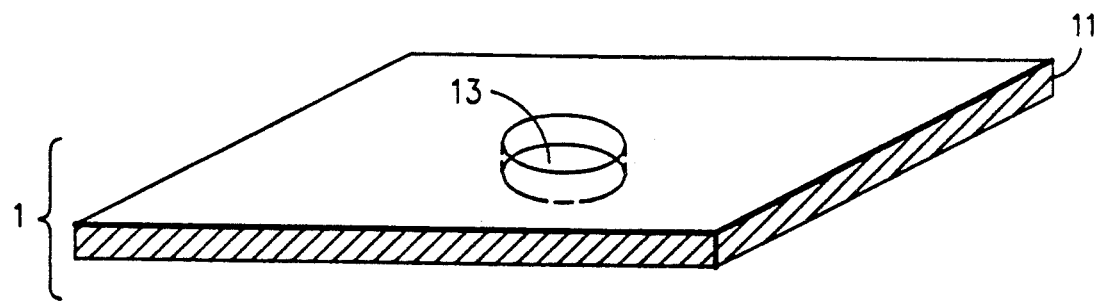
Figure 2B:
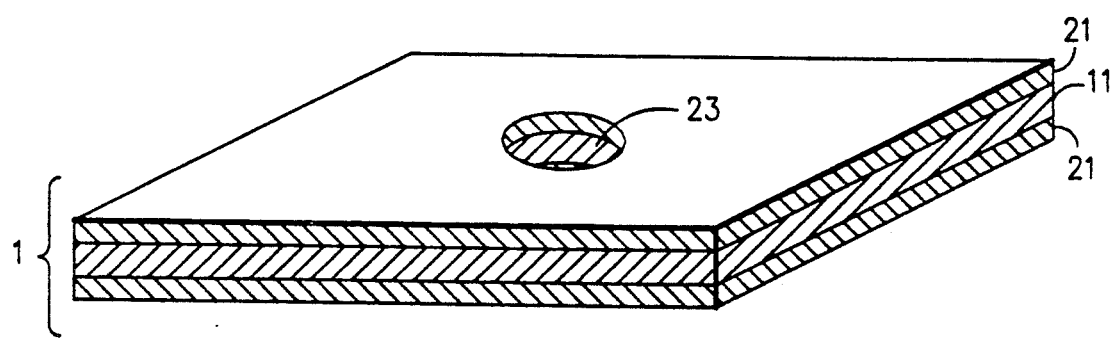
Figure 2C:
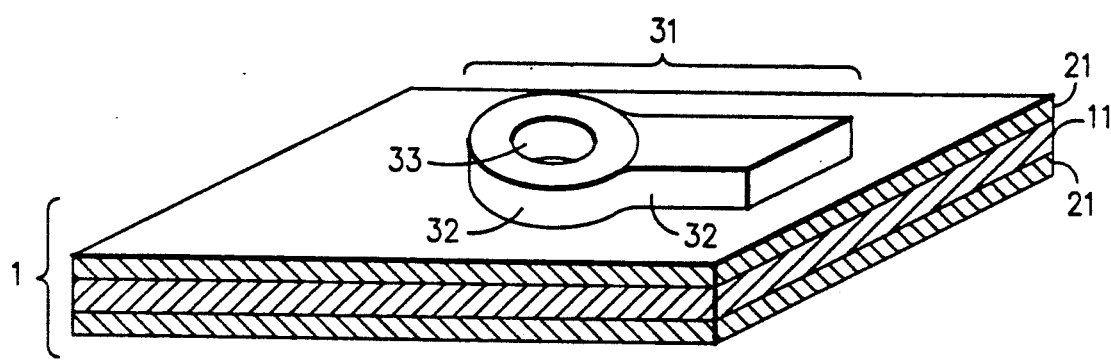

A individual metal core layer 1 is shown in three successive stages of fabrication FIGS. 2A, 2B, and 2C. FIG. 2A shows a metal foil 11 with a via or through hole 13 therein. As noted above, this metal foil 11 may be a single layer, of for example, copper, or it may be a tri-layer of Copper-Invar-Copper. This metal layer 11 is coated with an adhesive layer of chromium, not shown, and a conformal coating of the dielectric polymer 21 is applied thereto, as shown in FIG. 2B. The polymer coats the interior surfaces of the through hole 13 with a film of dielectric 23.

A thin layer of an adhesion promoter, as chromium or an organosilane coupling agent, is applied to the surfaces of polymer 21. A conductive film, as a copper film 31 is applied atop the adhesion promoter, and formed into circuit elements, as lead 32, and a plated through hole, with a conductive coating 32 inside the plated through hole 33.

Figure 3:
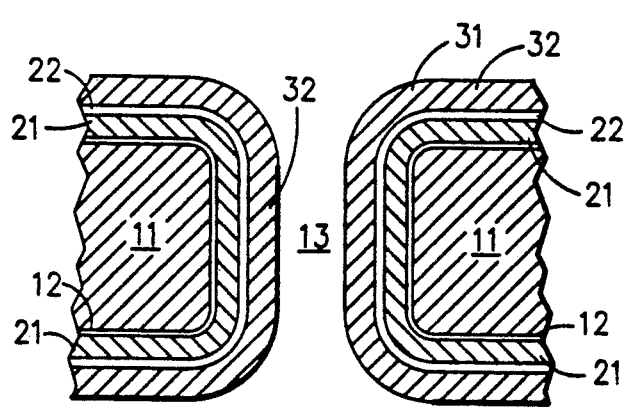
FIG. 3 is a cut away view of a section of a metal core package prepared according to the method of the invention.

A cutaway view of the metal core layer 1 is shown in FIG. 3. FIG. 3 shows the metal foil 11 with a via or through hole 13 therein. This metal layer 11 is coated with a thin adhesive layer of chromium, 12, and a conformal coating of the dielectric polymer 21. The polymer coats the interior surfaces of the through hole 13 with a film of dielectric 23. A thin layer 22 of an adhesion promoter, as chromium, is on the surfaces of polymer 21. A conductive film, as a copper film 31 is atop the adhesion promoter, and formed into circuit elements, and a conductive coating 32 inside the plated through hole 33.

The resulting circuitized layer has a precision drilled metal core, with a conformally coated, uniform, polymeric dielectric encapsulant, and circuitization leads thereon. A suitable adhesive is applied to the layer, and the layer is joined to another layer.

According to the method of the invention, it is now possible to accurately align the what have heretofore been etched, punched, and/or drilled vias and through holes with accurate through holes and vias that are conformally coated. It is also possible according to the method of the invention to form holes and vias of uniform size and quality relative to those formed by laser drilling or by punching. The method of the invention eliminates laser drilling and lamination with a rapid, low cost conformal coating process.

The resulting dielectric conformal coatings are from about 0.5 mil to about 2 mils thick, substantially uniform, and substantially free of pin-holes and pores.

While the invention has been described with respect to certain other preferred embodiments and exemplifications, it is not intended to limit the scope of the invention thereby, but solely by the claims appended hereto.

We claim:

1. A method of fabricating a multilayer electronic circuit package, having at least one layer thereof comprising a polymer encapsulated metal core, which method comprises:
   a. providing a metal foil for the metal core of the layer;
   b. forming at least one hole in the metal foil;
   c. applying an adhesion promoter to the perforate metal foil for subsequent adhesion of polymer thereto;

d. depositing a thermally processable dielectric polymer or precursor thereof onto exposed surfaces of the perforate metal foil including the walls of the hole;
e. thermally processing the dielectric polymer or precursor thereof to form a substantially uniform, conformal coating thereof on surfaces of the perforate metal foil;
f. circuitizing the surface of the dielectric polymer to form a circuitized, polymer coated, metal core layer; and
g. joining the circuitized, polymer coated, metal core layer to at least one other layer.

2. The method of claim 1 comprising applying a chromium film to the perforate foil as an adhesion promoter for subsequent adhesion of polymer to the perforate metal foil.

3. The method of claim 2 comprising sputter coating the chromium film to the perforate foil as an adhesion promoter for subsequent adhesion of polymer to the perforate metal foil.

4. The method of claim 2 comprising applying an organosilane to the metal core as an adhesion promoter.

5. The method of claim 1 comprising providing a copper foil metal core.

6. The method of claim 1 comprising providing a Copper-Invar-Copper foil metal core.

7. The method of claim 1 comprising providing a foil metal core having a thickness of from about 0.5 to about 4.0 mils.

8. The method of claim 1 comprising forming a through hole in the foil metal core having a diameter of about 3 to about 10 mils.

9. The method of claim 1 comprising providing a foil metal core having a thickness of about 0.5 to about 4.0 mils, and forming a through hole therethrough having a diameter of about 3 to about 10 mils.

10. The method of claim 9 wherein the thermally processable dielectric polymer or precursor thereof is chosen from the group consisting of polyimides, polyepoxides, polyfluorocarbons, and poly (para-xylylenes).

11. The method of claim 10 comprising the steps of:
a. forming a composition of the dielectric polymer or a precursor thereof in a carrier;
b. vaporizing the composition of the dielectric polymer or precursor thereof in the carrier;
c. conveying the composition of the dielectric polymer or the precursor thereof in the carrier to the metal core; and
d. condensing and thermally curing the composition of the dielectric polymer or precursor thereof in the carrier onto the metal core 12. The method of claim 16 comprising the steps of:
a. vaporizing a dimer of para-xylylene;
b. pyrolyzing the vaporized para-xylylene;
c. depositing the vaporized para-xylylene onto the metal foil core and forming poly (para-xylylene).

13. A method of fabricating a layer of a multilayer electronic circuit package, at least one of the layers comprising a polymer encapsulated metal core, which method comprises:
a. providing a metal foil for the metal core of the layer;
b. forming at least one hole in the metal foil;
c. applying an adhesion promoter to the perforate metal foil for subsequent adhesion of polymer thereto;
d. vaporizing a dimer of para-xylylene, pyrolyzing the vaporized para-xylylene, depositing the vaporized para-xylylene onto the metal foil core including the walls of the hole to form a poly (para-xylylene) conformal coating thereon; and
e. metallizing the surface of the dielectric polymer.

14. A method of fabricating a multilayer electronic circuit package, having at least one layer thereof comprising a polymer encapsulated metal core, which method comprises:
a. providing a metal foil for the metal core of the layer;
b. forming at least one hole in the metal foil;
c. applying an adhesion promoter to the perforate metal foil for subsequent adhesion of polymer thereto;
d. vaporizing a dimer of para-xylylene, pyrolyzing the vaporized para-xylylene, depositing the vaporized para-xylylene onto the metal foil core including the walls of the hole to form a poly (para-xylylene) conformal coating thereon;
e. metallizing the surface of the dielectric polymer; and
f. joining the polymer coated metal core layer to at least one other layer.

15. A method of fabricating a layer of a multilayer electronic circuit package, at least one of the layers comprising a polymer encapsulated metal core, which method comprises:
a. providing a metal foil for the metal core of the layer;
b. forming at least one hole in the metal foil;
c. applying an adhesion promoter to the perforate metal foil for subsequent adhesion of polymer thereto;
d. forming a composition of a dielectric poly (paraxylylene) polymer of precursor thereof in a carrier;
e. vaporizing the composition of the dielectric poly (paraxylylene) polymer or precursor thereof in the carrier;
f. conveying the composition of the dielectric poly (paraxylylene) polymer or precursor thereof in the carrier to the metal core;
g. condensing and thermally curing the composition of the dielectric poly (paraxylylene) polymer or the precursor thereof in the carrier onto the metal core to thereby deposit the thermally processable dielectric poly (paraxylylene) polymer or a precursor thereof onto exposed surfaces of the perforate metal foil including the walls of the hole;
h. thermally processing the dielectric poly (paraxylylene) polymer or precursor thereof to form a substantially uniform, conformal coating thereof on surfaces of the perforate metal foil; and
i. metallizing the surface of the dielectric polymer.

* * * * *